US008843805B1

(12) United States Patent
Goel et al.

(10) Patent No.: US 8,843,805 B1
(45) Date of Patent: Sep. 23, 2014

(54) MEMORY ERROR PROTECTION USING ADDRESSABLE DYNAMIC RAM DATA LOCATIONS

(75) Inventors: Deepak Goel, Sunnyvale, CA (US); Jeffrey G. Libby, Cupertino, CA (US); Anurag P. Gupta, Saratoga, CA (US); Abhijit Ghosh, Sunnyvale, CA (US); David J. Ofelt, Los Gatos, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 182 days.

(21) Appl. No.: 13/422,934

(22) Filed: Mar. 16, 2012

(51) Int. Cl.
  *G11C 29/00* (2006.01)
  *G11C 7/24* (2006.01)
  *G06F 11/10* (2006.01)
(52) U.S. Cl.
  CPC .............. *G11C 7/24* (2013.01); *G06F 11/1004* (2013.01); *G06F 11/1008* (2013.01)
  USPC .......................................... 714/766; 714/763
(58) Field of Classification Search
  CPC . G06F 11/1076; G06F 11/1008; G06F 11/08; G06F 11/1004; G06F 2201/002; G06F 2201/122; H05K 999/99; G11C 14/0009; G11C 7/24; G11C 7/1015; G11C 7/1045; G11C 29/52; G11C 16/22
  USPC .................. 714/766, 758, 763, 752, 710, 718
  See application file for complete search history.

(56) References Cited

U.S. PATENT DOCUMENTS

| 5,771,247 | A * | 6/1998 | Allen et al. .................. 714/763 |
| 7,990,993 | B1 * | 8/2011 | Ghosh et al. .................. 370/428 |
| 2001/0015908 | A1 * | 8/2001 | Katayama et al. ........ 365/185.03 |
| 2005/0172065 | A1 * | 8/2005 | Keays ............................ 711/103 |
| 2006/0053246 | A1 * | 3/2006 | Lee ................................ 711/100 |
| 2006/0271727 | A1 * | 11/2006 | Wang et al. .................... 711/103 |
| 2010/0229032 | A1 * | 9/2010 | Lee .................................... 714/6 |
| 2010/0274960 | A1 * | 10/2010 | Lee et al. ....................... 711/106 |
| 2011/0047439 | A1 * | 2/2011 | Jorda et al. .................... 714/763 |
| 2012/0079174 | A1 * | 3/2012 | Nellans et al. ................ 711/103 |

OTHER PUBLICATIONS

U.S. Appl. No. 12/266,298, by Kaushik Ghosh, filed Nov. 6, 2008.
U.S. Appl. No. 13/194,571, by Scott Mackie, filed Jul. 29, 2011.

* cited by examiner

*Primary Examiner* — Albert Decady
*Assistant Examiner* — Osman Alshack
(74) *Attorney, Agent, or Firm* — Shumaker & Sieffert, P.A.

(57) ABSTRACT

In general, techniques are described for efficiently and transparently partitioning a physical address space of a DRAM part lacking dedicated error protection circuitry to supply addressable error protection bytes for use in detecting and/or correcting bit errors elsewhere present in the physical address space. In one example, a network device includes a DRAM and a memory controller that receives a write command to write data to the DRAM. An address translation module of the memory controller logically partitions the DRAM to define a plurality of physically addressable sections that includes an error protection section for storing error protection bits and one or more data storage sections. The memory controller defines a contiguous logical address space representing the data storage sections. A DRAM controller of the network device communicates with the DRAM to store the data to one of the data storage sections in accordance with the contiguous logical address space.

23 Claims, 6 Drawing Sheets

MEMORY ERROR PROTECTION USING ADDRESSABLE DYNAMIC RAM DATA LOCATIONS

TECHNICAL FIELD

The invention relates to computer-based devices and, more particularly, to memory error protection within such devices.

BACKGROUND

Computer-based devices include one or more microprocessors, memory and associated logic that provide an execution environment for software. Such devices are susceptible to memory corruption caused by electromagnetic interference inside the devices that spontaneously toggles or "flips" bit values stored to the memory device, particularly when the memory device includes dynamic random access memory (DRAM) parts. Memory devices may also include or develop component defects that result in one or more storage bits becoming "stuck" at a particular bit value that cannot be altered by the write circuitry.

Error-correcting code (ECC) memory has been developed to include dedicated circuitry and dedicated redundant storage elements to enable hardware-based detection and, where possible, automatic correction of memory errors. ECC memory devices receive writable data and generate checksums from the binary sequences in the data bytes. ECC circuitry then writes the data to memory and also store the generated checksums to memory locations dedicated to error protection. For read operations, ECC memory devices retrieve data from memory in conjunction with the checksums generated for the retrieved data. ECC circuitry then recomputes the checksum to determine whether any of the retrieved data bits are corrupt in view of the retrieved checksums. Upon detecting corruption, the ECC circuitry corrects the error where possible and notifies the operating system or memory controller of the error where correction is not possible.

SUMMARY

In general, techniques are described for efficiently and transparently partitioning a physical address space of a dynamic RAM (DRAM) part lacking dedicated error protection circuitry to supply addressable error protection bytes for use in detecting and/or correcting bit errors elsewhere present in the physical address space. A DRAM part, such as double data-rate type three synchronous DRAM (DDR3) part, lacking dedicated error protection bytes includes a power of two number of addressable memory banks (1, 2, 4, or 8), with each bank containing a number of bits arranged as a two-dimensional array with rows of 1 KB or 2 KB. In one example of the described techniques, a memory controller logically partitions each row, or "page," of addressable physical memory within the DRAM part into eight sections and reserves one of the sections to store error protection bytes for data stored to the other seven sections. The memory controller presents a logical address space to other components and translates logical addresses for the logical address space to pack data bytes into row sections that are logically partitioned by the memory controller in the physical address space of the DRAM part for data storage. As a result, the memory controller operates the DRAM part as if dedicated error protection was available yet presents a logical address space to software that, although encompassing only seven sections of each row, is contiguous in that the logical address space visible to software does not include any holes reserved for error protection purposes.

The memory controller computes an error protection byte for each double word (eight consecutive bytes) of data and stores the error protection byte to the reserved error protection section of the row that also stores the double word. By arranging the data and error protection bytes in this way, the memory controller may later read both the double words and the corresponding error protection bytes by activating a single row. Because each row activation adds latency to DRAM part reads, the techniques may mitigate the memory bandwidth cost of transparently implementing error protection using a DRAM part that does not supply dedicated error protection.

In one example, a method includes receiving, with a memory controller of a computing device, a write command to write data to a dynamic random access memory (DRAM) comprising a plurality of banks, wherein each of the banks comprises DRAM storage elements arranged in a two-dimensional array of rows and columns, wherein each of the DRAM storage elements is a bit in an addressable physical address space. The method also includes logically partitioning, with the memory controller, the DRAM to define a plurality of physically addressable sections that includes an error protection section for storing error protection bits and one or more data storage sections. The method further includes defining, with the memory controller, a contiguous logical address space representing the data storage sections. The method also includes storing the data to one of the data storage sections in accordance with the contiguous logical address space.

In another example, a network device includes a dynamic random access memory (DRAM) comprising a plurality of banks, wherein each of the banks comprises DRAM storage elements arranged in a two-dimensional array of rows and columns, wherein each of the DRAM storage elements is a bit in an addressable physical address space. The network device also includes a memory controller that receives a write command to write data to the DRAM and an address translation module of the memory controller that logically partitions the DRAM to define a plurality of physically addressable sections that includes an error protection section for storing error protection bits and one or more data storage sections, wherein the memory controller defines a contiguous logical address space representing the data storage sections. The network device also includes a DRAM controller that communicates with the DRAM to store the data to one of the data storage sections in accordance with the contiguous logical address space.

In another example, a non-transitory computer-readable medium contains instructions. The instructions cause one or more programmable processors to receive a write command to write data to a dynamic random access memory (DRAM) comprising a plurality of banks, wherein each of the banks comprises DRAM storage elements arranged in a two-dimensional array of rows and columns, wherein each of the DRAM storage elements is a bit in an addressable physical address space. The instructions also cause the one or more programmable processors to logically partition the DRAM to define a plurality of physically addressable sections that includes an error protection section for storing error protection bits and one or more data storage sections, define a contiguous logical address space representing the data storage sections, and store the data to one of the data storage sections in accordance with the contiguous logical address space.

The details of one or more embodiments of the invention are set forth in the accompanying drawings and the descrip-

BRIEF DESCRIPTION OF DRAWINGS

Like reference characters denote like elements throughout the figures and text.

DETAILED DESCRIPTION

Figure 1:
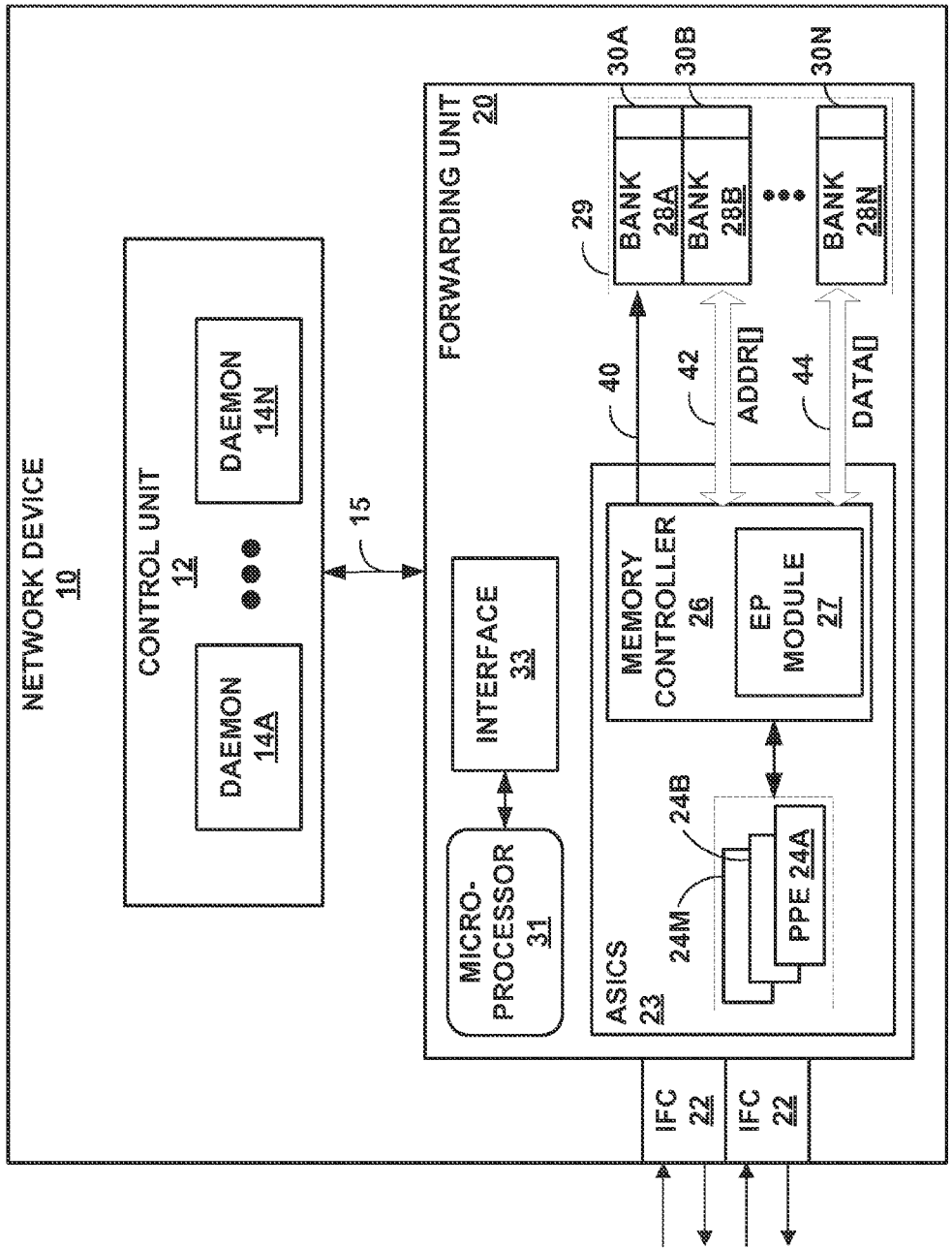
FIG. 1 is a block diagram illustrating an example network device having a memory controller that transparently partitions a physical address space of one or more memory parts to provide error protection in accordance with principles described in this disclosure.

FIG. 1 is a block diagram illustrating an example network device having a memory controller that transparently partitions a physical address space of one or more memory parts to provide error protection in accordance with principles described in this disclosure. Network device 10 may comprise a router such as a provider edge or customer edge router, a core router, or another type of network device, such as a switch.

In this example, network device 10 includes a control unit 12 that provides control plane functionality for the device. Network device 10 also includes example forwarding unit 20 that provides a data plane for forwarding network traffic. Forwarding unit 20 receives and sends data packets via interfaces of interface cards (IFCs) 22 each associated with forwarding unit 20. Forwarding unit 20 or components thereof may represent a packet forwarding engine (PFE). Forwarding unit 20 and IFCs 22 may reside on a single line card insertable within a network device 10 chassis. Example line cards include flexible programmable integrated circuit (PIC) concentrators (PFCs), dense port concentrators (DPCs), and modular port concentrators (MPCs). Each of IFCs 22 may include interfaces for various combinations of layer two (L2) technologies, including Ethernet, Gigabit Ethernet (GigE), and Synchronous Optical Networking (SONET) interfaces. In various aspects, forwarding unit 20 may comprise more or fewer IFCs. Some examples of network device 10 may include a plurality of such forwarding units interconnected by a switch fabric that provides a high-speed interconnect for forwarding incoming data packets to respective egress forwarding units for output over a network.

Control unit 12 is connected in this example to forwarding unit 20 by internal communication link 15. Internal communication link 15 may comprise a 100 Mbps Ethernet connection, for example. In various instances, internal communication link 15 may comprise a GigE or 10 GigE connection, a Peripheral Component Interconnect Express connection, or another type of connection. In the example of FIG. 1, daemons 14A-14N ("daemons 14") executed by control unit 12 are user-level processes that run network management software, execute routing protocols to communicate with peer routing devices, maintain and update one or more routing tables, and create one or more forwarding tables for installation to forwarding unit 20, among other functions.

Control unit 12 may include one or more processors (not shown in FIG. 1) that execute software instructions, such as those used to define a software or computer program, stored to a computer-readable storage medium (again, not shown in FIG. 1), such as non-transitory computer-readable mediums including a storage device (e.g., a disk drive, or an optical drive) and/or a memory such as random-access memory (RAM) (including various forms of dynamic RAM (DRAM), e.g., DDR2 SDRAM, or static RAM (SRAM)), Flash memory, another form of fixed or removable storage medium that can be used to carry or store desired program code and program data in the form of instructions or data structures and that can be accessed by a processor, or any other type of volatile or non-volatile memory that stores instructions to cause the one or more processors to perform techniques described herein. Alternatively, or in addition, control unit 12 may include dedicated hardware, such as one or more integrated circuits, one or more Application Specific Integrated Circuits (ASICs), one or more Application Specific Special Processors (ASSPs), one or more Field Programmable Gate Arrays (FPGAs), or any combination of one or more of the foregoing examples of dedicated hardware, for performing the techniques described herein.

While described with respect to a forwarding unit 20, the techniques are applicable to other components of a network device and in some cases to computing devices generally. For example, the techniques may be applied with the context of a service card or routing card of a network device.

PFE 20A includes one or more ASIC-based packet processors ("ASICs 23") that process packets to identify packet properties and perform actions bound to the properties. ASICs 23 include one or more programmable application-specific integrated circuits defining packet processing engines (PPEs) 24A-24M (collectively, "PPEs 24") that execute microcode (or "microinstructions") to control and apply fixed hardware components of ASICs 23 to process packets received by IFCs 22 coupled to forwarding unit 20.

PPEs 24 of ASICs 23 process packets by performing a series of operations on packets over respective internal packet forwarding paths as the packets traverse the internal architecture of network device 10. Operations may be performed, for example, on each packet by any of a corresponding ingress interface or an egress interface of forwarding unit 20 or other components of network device 10 to which the packet is directed prior to egress, such as one or more service cards (not shown). ASICs 23 store forwarding structures that, when executed, examine the contents of each packet (or another packet property, e.g., incoming interface) and on that basis make forwarding decisions, apply filters, and/or perform accounting, management, traffic analysis, and load balancing, for example. In one example, ASICs 23 arrange forwarding structures as next hop data that can be chained together as a series of "hops" along an internal packet forwarding path for the network device. The result of packet processing determines the manner in which a packet is forwarded or otherwise processed by forwarding unit 20 from its input interface on one of IFCs 22 to its output interface on one of IFCs 22. Further details regarding packet processing operations of components of forwarding unit 20 is available in PLATFORM-INDEPENDENT CONTROL PLANE AND LOWER-LEVEL DERIVATION OF FORWARDING STRUCTURES, U.S. application Ser. No. 12/266,298, filed Nov. 6, 2008; and in PACKET FORWARDING PATH PROGRAMMING USING A HIGH-LEVEL DESCRIPTION LANGUAGE, U.S. application Ser. No. 13/194,571, filed Jul. 29, 2011; each of which being incorporated herein by reference in its entirety.

In general, microprocessor 31 programmatically configures ASICs 23 and executes software to provide a communication interface 33 for messaging between forwarding unit 20 and control unit 12. Microprocessor 31 may, for example, execute a microkernel to provide an operating environment for interface 33 to receive forwarding structures from control unit 12. Daemons 14 may invoke interface 33 to modify forwarding structures stored by forwarding unit 20 to influence packet processing by PPEs 24.

ASICs 23 include high-speed memory (not shown) to store forwarding structures, packet key buffers, packet result buffers, and/or other instructions and intermediate data. ASICs 23 use data buffer 29 to store packet data for packets queued in forwarding unit 20 for processing, store backup forwarding structures, and/or store any other data or metadata used by ASICs 23 to process packets. Data buffer 29 includes banks 28A-28N (collectively, "banks 28") dispersed among one or more DRAM parts or modules, such as dynamic in-line memory modules (DIMMs) or small outline DIMMs (SO-DIMMs), of forwarding unit 20. In some examples, banks 28 include eight banks.

Each of banks 28 includes dynamic random-access memory (DRAM) elements arranged in a two-dimensional array of rows and columns, with each element in the array representing one storage bit. Each storage bit of data buffer 29 is addressable (as part of a group of storage bits, e.g., an octet, word, or double-word) for use by ASICs 23 in storing and accessing buffered data. That is, banks 28 do not include, in addition to storage bits addressable by ASICs 23, dedicated error protection circuitry that supply addressable error protection bytes for use in detecting and/or correcting bit errors elsewhere present in the physical address space of banks 28. Banks 28 may thus present a contiguous physical address space to ASICs 23 and, in particular, to memory controller 26.

Memory controller 26 may be integrated within one or more of ASICs 23, as shown in the example of FIG. 1, or may be provided by a separate integrated circuit or by a programmable processor. Memory controller 26 of ASICs 23 mediates access to data buffer 29 to present a logical address space to PPEs 24. Memory controller 26 receives commands from PPEs 24 to read/write data to data buffer 29 to logical addresses mapped by memory controller 26, according to techniques described herein, to the physical address space of banks 28 of data buffer 29. Memory controller 26, in response, issues corresponding DRAM commands to data buffer 29 over command interface 40 directing one or more banks 28 to read/write data presented on data bus 44 to the address presented on address bus 42. Address bus 42 include address bus 42 may include separate signal lines for selection of banks 28. Banks 28 of data buffer 29 operate to read/write the data presented on data bus 44 to the address presented on address bus 42 based on the commands received on command interface 40.

In accordance with techniques of this disclosure, memory controller 26 includes error protection module 27 (illustrated as "EP module 27") that logically partitions each row, or "page," of banks 28 to reserve a corresponding one of error protection sections 30A-30N to store error protection bytes for data stored to the remainder of the bank. FIG. 1 illustrates error protection sections 30A-30N for corresponding banks 28A-28N. While illustrated as segregated from the remainder of each of banks 28, each of error protection sections 30 includes storage bytes that are part of the addressable physical address space of the corresponding one of banks 28. That is, error protections sections 30 are logically partitioned by memory controller 26 within the general-purpose, addressable memory space provided by banks 28. As such, error protection sections 30 are neither redundant nor physically segregated from the remaining storage bits of banks 28, and are not associated with separate error protection circuitry that defines separate error protection functionality for error protection sections 30 in the DRAM parts that supply data buffer 29. In other words, while the physical address space presented by banks 28 includes both error protection sections 30 and the remainder of each of banks 28, the logical address space presented by memory controller 26 to PPEs 24 does not include error protection sections 30.

Error protection module 27 translates logical addresses received from PPEs 24 for the logical address space to the physical address space presented by banks 28 to pack data bytes into row sections that are partitioned for data storage. In this way, memory controller 26 may be invoked by PPEs 24 to store/retrieve packet data and backup forwarding structures, for example, to the data storage portions of banks 28. Moreover, the logical address space presented by PPEs 24 by memory controller 26 may be contiguous by operation of error protection module 27 despite each row of banks 28 including error protection bytes for the corresponding one of error protection sections 30. Using the logical address space presented by memory controller 26, PPEs 24 may therefore avoid accounting for error protection bytes in the physical address space of data buffer 29 when addressing data buffer 29.

Memory controller 26 receives writable data from PPEs 24 for logical addresses in the logical address space presented by memory controller 26 to PPEs 24. Memory controller 26 writes the writable data to one or more of banks 28 in write bursts, where each burst includes a defined plurality of bytes to write to a particular row in one of banks 28 of data buffer 29. In some examples, a write burst writes eight bytes of data to one or banks 28. For each write burst, error protection module 27 computes error protection bits for the writable data to be written. Error protection bits may be calculated by error protection module 27 according to error-detecting and/or error-correcting code (ECC) techniques such as Hamming codes or an extended Hamming code known as "single error correction, double error detection" (SECDED). Other techniques for calculating error protection bits may include multidimensional parity codes, Golay codes, and Reed-Solomon codes, for instance. In some examples, error protection module 27 computes one error protection byte for the writable data in each write burst.

For each write burst, memory controller 26 computes a physical address for the write burst based on the logical address provided to memory controller 26 by PPEs 24. The physical address defines a leading physical address for a group of storage bits having a length equal to the write burst size and located within a single row of one of banks 28. In addition, memory controller 26 computes a physical address that is located in the single row for the error protection bits computed by error protection module 27 for the write burst data. That is, the physical address for the write burst data and the physical address for the error protection bits are both located in a single row of one or banks 28. Upon computing the two physical addresses, memory controller 26 activates the single row and issues separate write commands by command interface 40 to write both the writable data for the write burst as well as the computed error protection bits for the writable data to the corresponding physical addresses in the single row of one of banks 28.

On a subsequent request by one of PPEs 24 to access the data written in the write burst, EP module 27 recomputes the physical address for the data and the physical address for the error protection bits based on a logical address provided by the PPE. Memory controller 26 activates the single row of one of banks 28 that contains the data and the error protection bits, then issues separate read commands to read both the data and the error protection bits for the data from the corresponding physical addresses in the single row. EP module 27 recomputes error protection bits based on the data read from data buffer 29 and compares the recomputed error protection bits to the error protection bits read from data buffer 29. If the recomputed error protection bits and read error protection bits match, memory controller 26 provides the data read from data buffer 29 to PPEs 24. Otherwise, EP module 27 may attempt to correct the erroneous data using the read error protection bits and direct memory controller 26 to provide the corrected data to PPEs 24. If error correction is not possible, memory controller 26 may indicate to PPEs 24 that the requested data is corrupt.

Adding error protection bits to data buffer 29 that does not include dedicated error protection circuitry or redundant storage bits for error protection bits according to the above-described techniques may provide forwarding unit 20 with affordable error protection for large data structures involved in packet buffering and forwarding structure backup, for instance. Moreover, by arranging storage of data and corresponding error protection bits within data buffer 29 to a single corresponding row, write/read transactions made with respect to banks 28 and mediated by memory controller 26 may mitigate the memory bandwidth cost of implementing such error protection by distributing a single row activation latency among the multiple read/write transactions required for error protection.

Figure 2:
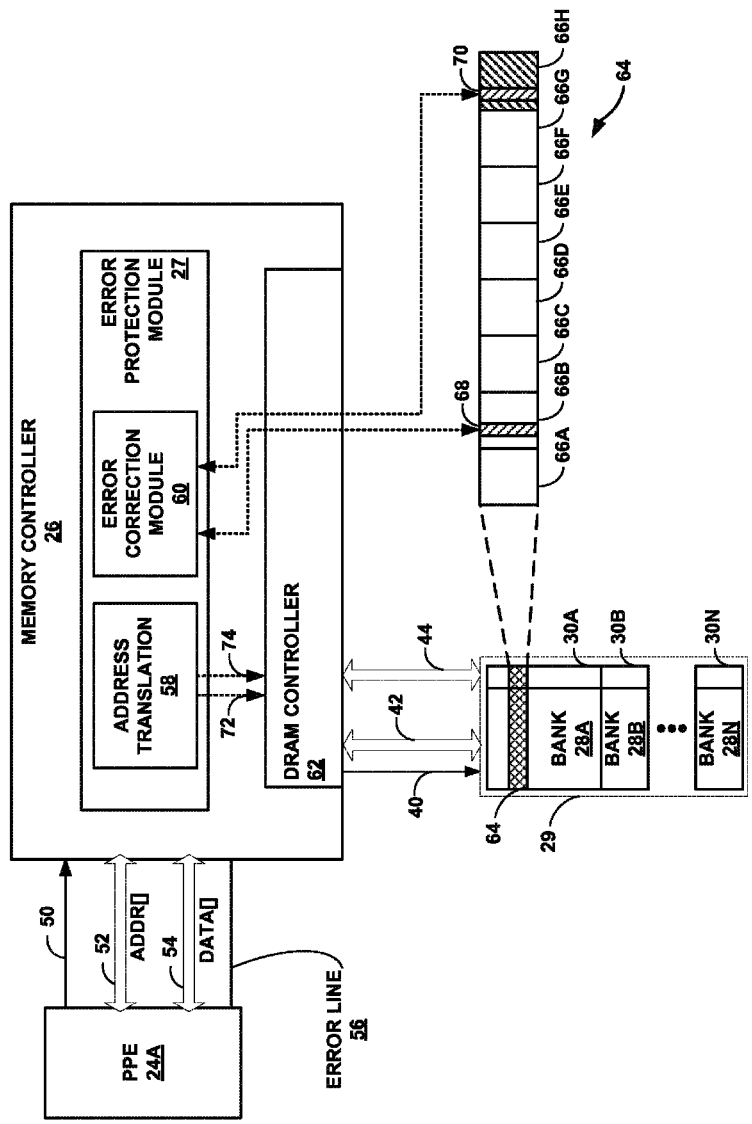
FIG. 2 is a block diagram illustrating example components of a network device that implements error protection according to techniques described herein.

FIG. 2 is a block diagram illustrating example components of a network device that implements error protection according to techniques described herein. PPE 24A executes to write data to data buffer 29 for subsequent access. PPE 24A provides data to be written, together with a logical address and a write command, to memory controller 26. Memory controller 26 includes signaling interfaces by which PPE 24A provides control and data signals to direct the operation of memory controller 26. In the illustrated example, PPE 24A and memory controller 26 share a data bus 54 and an address bus 52. In some examples, data bus 54 may have a 64 bit width for writing/reading double words to/from data buffer 29. The value of address bus 52, as driven by PPE 24A (or other PPEs 24), defines an address within the logical address space generated by memory controller 26 by translating physical addresses within a physical address space defined by data buffer 29 according to techniques described herein. Memory controller 26 drives error line 56 connecting PPE 24A and memory controller 26 to indicate an uncorrectable memory error in data buffer 29. While illustrated in this example as separate busses each having one or more signal lines, data bus 54, address bus 52, and error line 56 may be implemented using a crossbar or other switch by which multiple PPEs 24 may interface with memory controller 26 to write/read data to/from data buffer 29.

PPE 24A issues commands 50 on a command interface to direct memory controller 26 handling of data and address values presented on address bus 52 and address bus 54. The command interface may include one or more signal lines, different value combinations of which specify different commands to memory controller 26. The command interface may include a switching interface by which PPEs 24 may send command packets to memory controller 26. Each of commands 50 may specify one of a single double-word (DW) read transaction, an eight DW read transaction, and a DW write transaction. A word, in the examples of FIGS. 2-3, refers to a four byte value, while a double-word refers to an eight byte or 64 bit value.

Memory controller 26 writes/reads data to data buffer in bursts of eight bytes. PPE 24A may therefore align address values (memory locations) to double-word boundaries of the logical address space presented by memory controller 26, and memory controller 26 may therefore align address values (memory locations) to double-word boundaries of the physical address space presented by data buffer 29. Accordingly, memory controller 26 upon receiving a single DW read transaction command from PPE 24A reads and returns a DW from a DW-aligned address in the physical address space presented by data buffer 29. Likewise, memory controller 26 upon receiving an eight DW read transaction command from PPE 24A reads and returns eight consecutively stored DWs from an eight DW-aligned address in the physical address space presented by data buffer 29. Likewise, memory controller 26 upon receiving a write DW read transaction command from PPE 24A writes a DW to a DW-aligned address in the physical address space presented by data buffer 29. As described in further detail below, address translation module 58 computes the physical address in the physical address space based on the logical address presented on address bus 52 according to techniques herein described.

Dynamic RAM (DRAM) controller 62 implements a DRAM interface to banks 28 to read/write data. DRAM controller 62 may be integrated within memory controller 27 or, alternatively, implemented on a separate chip and connected to memory controller 27 by a communication interface. In various examples, banks 28 may include DDR type one synchronous DRAM (SDRAM) (DDR1), DDR type two SDRAM (DDR2), DDR type three SDRAM (DDR3), DDR type four SDRAM (DDR4), multibank DRAM (MDRAM), single data rate DRAM (SDR), or other type of dynamic memory. In each such example, DRAM controller 62 implements a corresponding interface for the particular type of dynamic memory presented by banks 28 in the example. For instance, DRAM controller 62 may implement a DRAM interface compliant with DDR3 SDRAM. In some examples, memory controller 26 may include multiple DRAM controllers to each interface with a different DRAM part to foster an aggregated, contiguous physical memory space composed of each of the physical memory spaces of the various DRAM parts. Memory controller 26 selects, in such examples, the appropriate DRAM part and corresponding DRAM controller based on logical addresses received from PPEs 24, as well as the number and memory size of such DRAM parts. In such examples, each DRAM part may have separate address and data busses and command interfaces to the corresponding DRAM controller. For ease of depiction and description, the techniques are described in FIG. 2 with respect to one DRAM part having banks 28.

In this example, DRAM controller 62 issues commands 40 to read/write data to active rows of banks 28 in bursts of eight consecutive bytes. Each read or write command is preceded by an activate command that opens a row of memory in one of banks 28 to enable future accesses with minimum latency. The activate command incurs an activate latency before DRAM controller 62 may issue a read or write command to the activated row. As a result, sequential read/write accesses to a currently active row of one of banks 28 may achieve higher throughput than sequential read/write accesses to different rows of the banks. Commands 40 may be issued by DRAM controller 62 over a command interface having multiple signal lines, different combinations of which indicating different commands according to the DRAM truth table for commands 40 for banks 28. The command interface may include, for instance, Row Address Strobe, Column Address Strobe, Write Enable, Chip Select, Clock and Differential Clock outputs, Data Strobe, and Data Mask signals (not shown).

Error protection module 27 logically partitions banks 28 to include error protections sections 30. More specifically, error protection module 27 logically partitions each row of each of banks 28 to include a plurality of sections allocated for data storage and one section allocated to store error protection bits for data stored to the data storage sections.

Error correction module 60 of error protection module 27 computes error correction bits for writable data received from PPE 24A for storage to data buffer. In addition, error correction module 60 detects and, where possible, corrects errors in data read from data buffer 29 based on error correction bits previously computed for the data and stored to error protection sections 30. Address translation module 58 of error protection module 27 translates logical addresses received from PPE 24A to physical addresses to pack data into data storage sections of rows of banks 28 and to compute physical addresses within error protection sections 30 of banks 28 in which to store error protections bits for corresponding data storage sections.

In the example of FIG. 2, error protection module 27 logically partitions each row of banks 28 into eight sections. Seven sections of each row store data and the eighth section of each row stores error protection bits for all data stored to the row. For instance, row 64 of bank 28A illustrates sections 66A-66H. Sections 66A-66G store data. Section 66H stores error protection bits for the data stored to sections 66A-66G. Section 66H thus forms part of error protection section 30A of bank 28A.

Memory controller 26 receives a command in commands 50 to write/read a DW to/from data buffer 29 at a logical address received on address bus 52. In the case of a write command, error correction module 60 computes an error protection byte for a double word received on data bus 54. Based on the logical address received, address translation module 58 computes physical address 68 that is located in section 66B of row 64. Address translation module 58 additionally computes physical address 70 that is located in section 66H of row 64. In the case of a write command, error protection module 27 writes the DW to physical address 68 and also writes the error protection byte to a byte within the double word space located at physical address 70. To write a single byte within the double word space, error protection module 27 may clear (i.e., set to low) a Data Mask pin signal of the control interface that is associated with the byte location to be written. The remaining Data Mask pins, set to high, suppress writing to the other byte locations in the DW to allow byte-level writes.

In the case of a read command, error protection module 27 reads the DW at physical address 68 and also reads the error protection byte within the DW at physical address 70. Error correction module 60 verifies the integrity of the DW read from physical address 68 using error-detecting and/or error-correcting code (ECC) techniques and the error protection byte read from physical address 70. If an error is detected, error correction module 60 may attempt to correct the error. If no error is detected or error correction is successful, error protection module 27 returns the requested DW to PPE 24. If error correction is not possible, error protection module 27 sets error line 56 to indicate the requested DW is corrupt.

Figure 3:
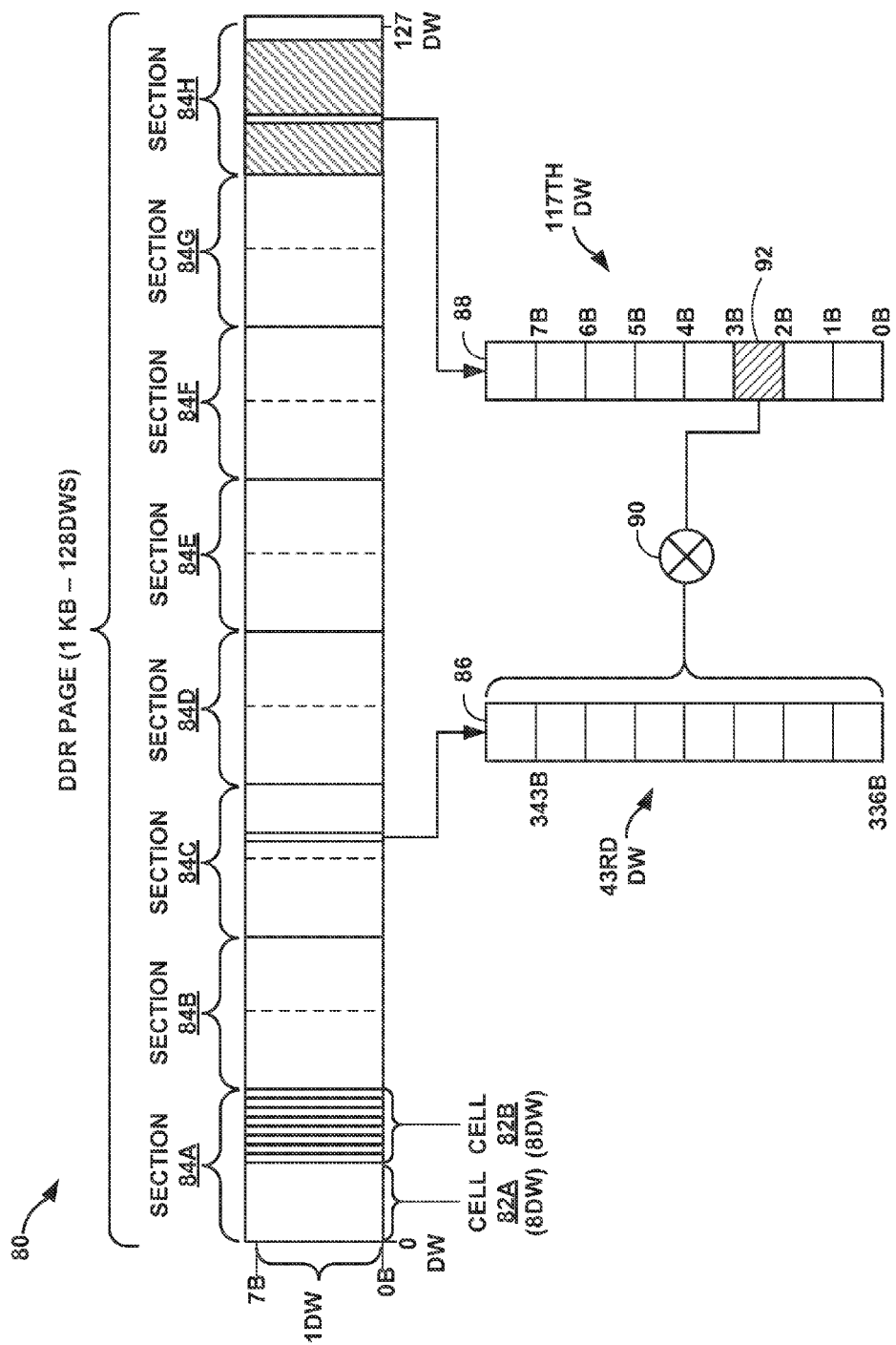
FIG. 3 is a block diagram illustrating an example row of a dynamic RAM bank that is logically partitioned to include an error protection section in accordance with techniques of this disclosure.

FIG. 3 is a block diagram illustrating an example DDR page, corresponding to a row of a DRAM ban k, that is logically partitioned to include an error protection section in accordance with techniques of this disclosure. In this example, row 80 is a 1 KB DDR page that includes eight logical sections 84A-84H (collectively, "sections 84") of equal size (128 bytes or 16 DWs). Each section is sub-divided into two cells, with each cell having eight DWs. For example, section 84A includes cells 82A-82B each encompassing eight DWs. For descriptive purposes, row 80 is illustrated as having an eight byte (one DW) height to denote memory controller 26 writes/reads data to/from row 80 in eight byte bursts. Some examples of row 80 may represent a different-size DDR page, such as 2 KB or 4 KB, for various other examples of DDR banks.

Each DW is any of sections 84A-84G is associated by error protection module 27 with one byte in section 84H that stores an error protection byte value for the DW. Furthermore, because a cell includes eight DWs, each cell is associated by error protection module 27 with a DW in section 84H that stores eight error protection byte values for the eight DWs of the cell. For example, DW 86 of section 84C is the 43rd DW of row 80 and includes bytes 336 through 343 of the 1,024 bytes of row 80. DW 86 is associated by error protection module 27 with error protection byte 92, the third byte of DW 88 of section 84-H, which is the 117th DW of row 80. Error correction code algorithm 90, when applied to DW 86, produces the error protection byte stored to the third byte of DW 88.

By partitioning rows of banks 28 in this manner, error protection module 27 of memory controller 26 ensures that DWs and corresponding error protection bytes are stored to the same row in banks 28. As a result, memory controller 26 incurs only one activate latency for to read or write both DW 86 and its corresponding error protection byte 92. Fourteen DWs of section 84H are adequate to store error protection bytes for the 112 DWs of sections 84A-84G. The last two DWs of section 84H may therefore remain unused, resulting in an insignificant 1.5625% memory bits wastage in view of large DRAM capacities.

Memory controller 26 may in some instances perform an eight DW read to read eight consecutively stored DWs from an eight DW-aligned address (i.e., a cell) and a single DW read to read the DW in section 84H that stores the eight error protection bytes for the cell. For example, memory controller 26 may activate row 80 of bank 28A, issue eight read DW commands to bank 28A to read each of the eight DWs in cell 82B of section 84A, then issue a read DW command to bank 28A to read the DW (i.e., the 113th DW) in section 84H that stores the eight error protection bytes for the data stored to cell 823. As a result, memory controller 26 may perform nine read transactions to read and verify the integrity of eight DWs, further improving the memory read bandwidth. Memory controller 26 may in some instances perform fewer than eight DW reads so long as the DWs to be read are all located in the same cell.

Figure 4A:
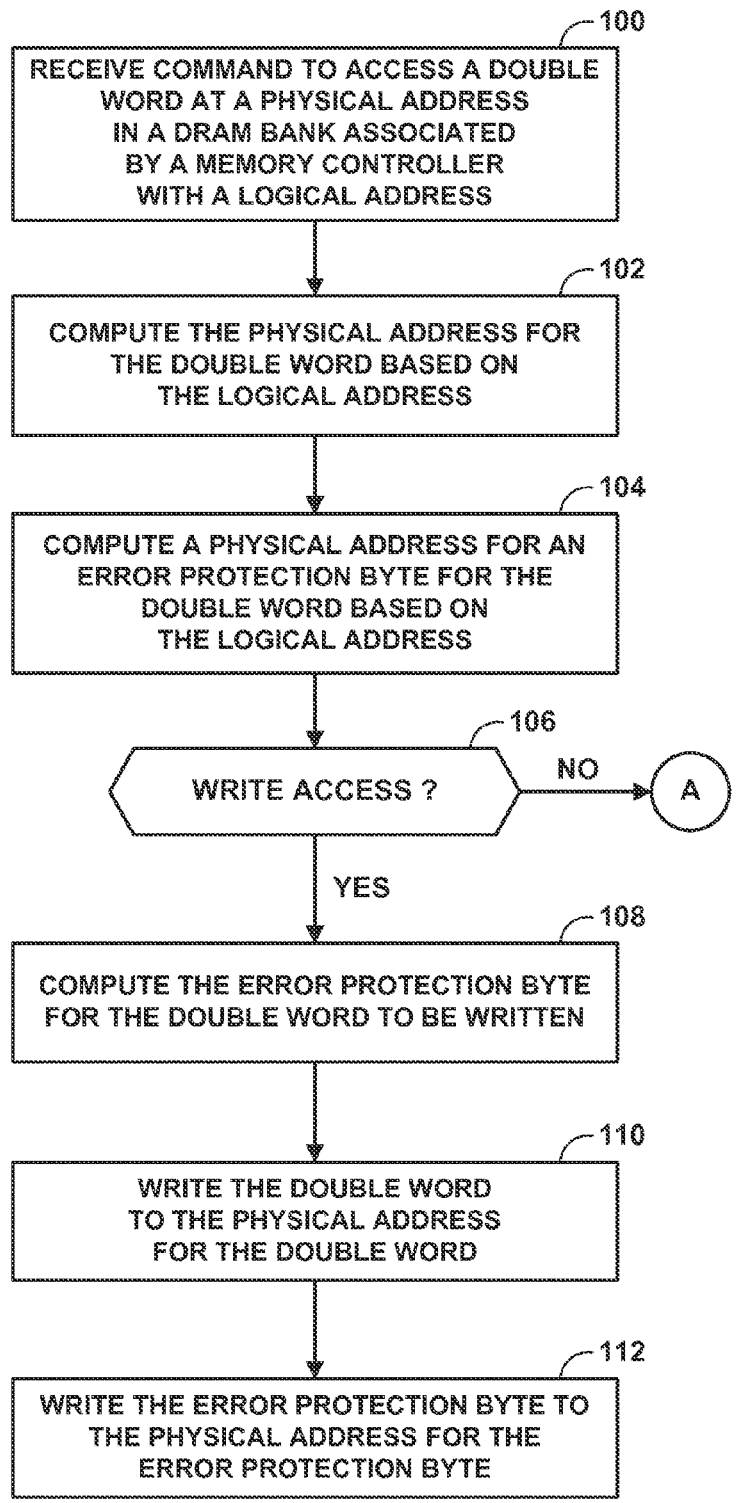
FIGS. 4A-4B depict a flowchart illustrating an example mode of operation of a memory controller to implement error protection in dynamic RAM according to the techniques described herein.
Figure 4B:
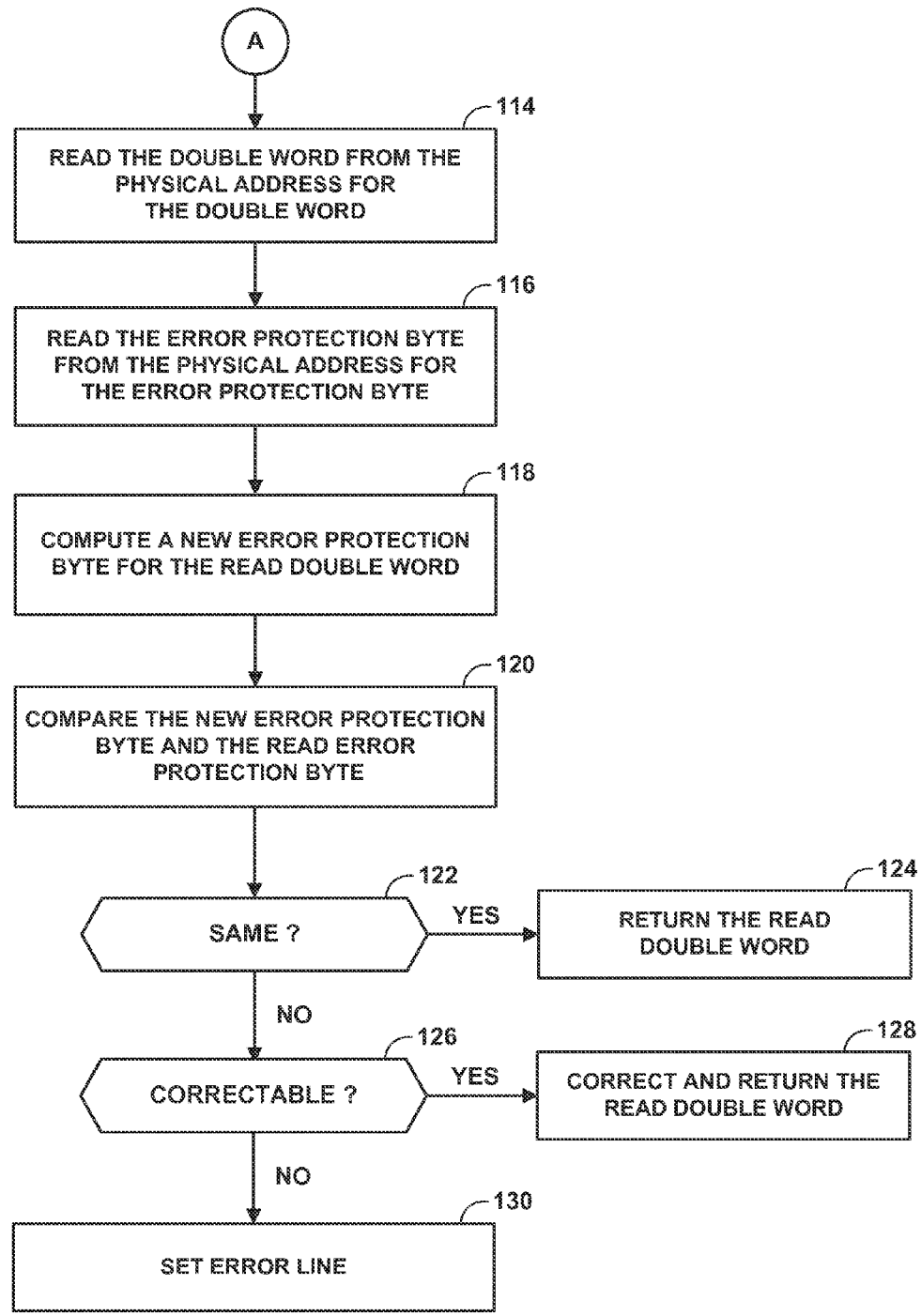

FIGS. 4A-4B depict a flowchart illustrating an example mode of operation of a memory controller to implement error protection in dynamic RAM according to the techniques described herein. The example mode of operation is described with respect to memory controller 26 of FIG. 2.

Memory controller 26 receives one of commands 50 on a command interface directing memory controller 26 to access a double word in one of banks 28 at a logical address in the logical address space presented by memory controller 26 (100). Address translation module 58 reads the logical address from address bus 52 and computes a physical address for the double word to be accessed (102). Address translation module 58 computes the physical address for the double word to be accessed to pack data stored to banks 28 to sections of banks 28 partitioned for storage.

In some examples, address translation module 58 computes the physical address for the double word in a selected bank to conform to the following DDR memory bank address structure:

TABLE 1

| Field | Size | Position |
|---|---|---|
| Row number | 17 | [23:7] |
| Section number | 3 | [6:4] |
| Cell number | 1 | [3] |
| Double word number | 3 | [2:0] |

Example Table 1 includes values for DDR memory banks each capable of storing 256 MB in rows of 1 KB. Different DDR memory bank types in various examples may have different capacities and row sizes and therefore have different values for Table 1 fields. Address translation module 58 may select one of banks 28 to access according to the most significant bits of the logical address for the double word and the number of banks, N. In some instances, address translation module 58 further accounts for a plurality of DRAM parts to select a DRAM part number to access.

In some examples, address translation module 58 computes, based on the logical address, the physical address for the double word in a selected bank to conform to the above DDR memory bank address structure according to the following function:

```
// PAGE_SIZE 1024;
void create_dw_address_structure (
  int logical_addr, /* Logical address recd by memory
  controller */
    int& row_num,
    int& section,
    int& cell,
    int& dw_num)
{
  int page_size_dws = PAGE_SIZE >> 3;
  logical_addr &= 0xFFFFFF; // [23:0]
  int absolute_dw = logical_addr >> 3;
  // A bank ROW number
  row_num = absolute_dw / (page_size_dws * 7/8);
  row_num = row_num >> 7; // [23:7]
  // Nth DW in the page
  int page_dw = absolute_dw % (page_size_dws * 7/8);
  section = (page_dw >> 4) &= 0x8; // [6:4]
  cell = (page_dw >> 3) &= 0x1; // [3]
  dw_num = page_dw &= 0x8; // [2:0]
}
```

Address translation module 58 may use the above function in conjunction with bank selection to determine a bank address in one of banks 28 to conform to the DDR memory bank address structure depicted in Table 1. The above function packs data to be written to banks 28 to row sections logically partitioned for storage while leaving error protection sections 30 available to store error protection bytes to the error protection sections of corresponding rows.

In some examples, address translation module 58 uses spray logic to spray double words that are contiguous in the logical address space defined by memory controller 26 among multiple banks 28 and/or banks of different DRAM parts that make up data buffer 29. In this way, memory controller 26 may paralyze data access to improve memory bandwidth. In some examples, address translation module 58 sprays double words across banks and parts using logic that functionally conforms to the following pseudocode:

```
//Spray Function: This function sprays address across odd
  number of parts
//np : Number of parts.
//iter : Iteration number, should be put to 0.
//nb : Number of banks, should be power of 2.
//rup : Round up of np to next power of 2
//sftv : Shift value. (should be power of rup)
//spn : Sprayed part number. Should be set to 0 before calling
  spray function.
//sbn : Sprayed bank number.
//sba : Sprayed bank address,
void spray (int addr, int iter, int np, int nb, int rup, int sftv,
int & spn, int &sbn, int & sba) {
  int x, y, z;
  sbn = (iter ==0) ? addr%nb : sbn;
  x = addr % rup;
  y = addr / rup;
  z = y %nb;
  spn = (x+spn) % np;
  if (x < np) {
    sbn = (sbn + z) % nb;
    sba = (int) (floor (y/nb));
    return;
  } else {
    //Insert x at proper position. determined by sftv.
    y = ((int)floor(y/sftv))*sftv*rup + x*sftv + y%sftv;
    spray (y, iter+1,np, nb, rup, sftv/rup, spn,sbn, sba)
  }
}
```

Address translation module 58 may apply logic to the logical address to generate a DRAM part number, a bank number, and, a section number, and bank address fields for the DDR address structure depicted in Table 1 according to the following pseudocode that uses the spray function encoded above:

```
adr = logical_address;
adr = adr % (num_part*psz_dw*7/8);
ssz_dw = part_sz_dw/(8* num_banks)
int psz_2gb_dw = (int) pow (2, 25);
int ssz_2gb_dw = psz_2gb_dw/(ns*nb);
//Reduce np to npo * npe
npo = np; npe = 1;
while (npo%2 != 1) {
  npo /= 2; npe *= 2;
}
int rup = (int) pow (2, ceil(log2(npo)));
int sftv = (int) pow (rup, floor(log2(ssz_2gb_dw)/log2(rup)));
ddr_spray (addr, npe, npo, rup, sftv, psz_dw, nb, ns, spn, snum,
bnum, spa);
//DDR SPRAY function:
//npe : Even factor of number of parts.
//npo : Odd factor of number of parts.
//rup : Round up of odd number of parts.
//sftv : Shift value.
//psz_dw : Part size in DW
//nb : Number of banks
//ns : Number of section.
// spn : Sprayed part number.
//snum : Section number
//sbn : Sprayed bank number
//spa : sprayed bank address
//dwas : double word access size
// Input address should be in DDR address space limit.
void ddr_spray (int in_addr, int npe, int npo, int rup, int sftv, int
psz_dw, int nb, int ns, int & spn,
int & snum, int & sbn, int & sba) {
```

```
    int ssz_dw, np, mas, dwas, iter;
    dwas = 8
    np = npe * npo;
    ssz_dw = psz_dw/(ns*nb);
    int addr = in_addr;;
    snum = addr /(np * nb * ssz_dw);
    addr = addr %(np * nb * ssz_dw);
    int dw_addr = addr%dwas;
    addr = addr / dwas;
    //Offset required parameters by dwas
    ssz_dw = ssz_dw / dwas;
    // sftv = sftv / dwas; //SFTV is calculated properly.
    //remove lower bits of address to determine lower bits of
sprayed part number
    int spn_even = addr % npe;
    addr = addr /npe;
    if (npo == 1) {
        spn = spn_even; sbn = addr%nb; sba = (int) floor(addr/nb);
    } else {
        int addr_leftover = (addr % (nb*ssz_dw))/sftv;
        addr = ((int)floor(addr/(nb*ssz_dw)))*sftv + addr%sftv;
        spn = 0; sbn=0; iter = 0;
        spray (addr, iter, npo, nb, rup, sftv, spn, sbn, sba);
        spn = spn*npe + spn_even;
        sba = (addr_leftover*sftv)/nb + sba;
    }
    sba = sba*dwas + dw_addr;
    return;
}
```

Translation module 58 also compute a physical address for an error protection byte for the double word that is also based on the logical address read from address bus 52 (104). In some examples, address translation module 58 computes the physical address (DW-aligned) and DW byte number for an error protection byte for a received logical address according to the following function, in conjunction with selecting a bank and, in some instances, a DRAM part number:

```
// PAGE_SIZE 1024;
void create_ecc_byte_address_structure(
    int logical_addr,
    int& ecc_row_num,
    int& ecc_section,
    int& ecc_cell,
    inn& ecc_dw_nun,
    int& ecc_byte)
{
    int page_size_dws = PAGE_SIZE >> 3;
    logical_addr &= 0xFFFFFF; // [23:0]
    int absolute_dw = logical_addr >> 3;
    // A bank ROW number
    ecc_row_num = absolute_dw / (page_size_dws * 7/8);
    ecc_row_num = ecc_row_num >> 7; // [23:7]
    // Nth DW in the page
    int ecc_page_dw = absolute_dw % (page_size_dws * 7/8);
    // 3rd DW -> byte 3, 11th DW -> byte 3, etc.
    ecc_byte = ecc_page_dw &= 0x8;
    // In the error protection section.
    int ecc_section_start_dw = (page_size_dws * 7/8);
    ecc_page_dw = ecc_section_start_dw + (ecc_page_dw >> 3);
    ecc_section = (page_dw >> 4) &= 0x8; // [6:4]
    ecc_cell = (page_dw >> 3) &= 0x1; // [3]
    ecc_dw_num = page_dw &= 0x8; // [2:0]
}
```

If the received command specifies a single write access (YES branch of 106), error correction module 60 computes an error protection byte for the double word to be written using, for example, one of the aforementioned error protection and/or correction techniques described above (108). Error protection module 27 invokes DRAM controller 62 to write the double word to the physical address in banks 28 computed for the double word (110). In addition, error protection module 27 invokes DRAM controller 62 to write the error protection byte to the physical address in banks 28 computed for the error protection byte (112). Error protection module 27 writes the double word and the error protection byte to the same row or page in banks 28.

If the received command specifies a single read access (NO branch of 106), error protection module 27 invokes DRAM controller 62 to read the double word from the physical address in banks 28 computed for the double word (114). In addition, error protection module 27 invokes DRAM controller 62 to read the error protection byte from the physical address in banks 28 computed for the error protection byte (116).

Error correction module 60 computes a new error protection byte for the double word read from banks 28 (118) and compares the new error protection byte to the error protection byte read from banks 28 (120). If the new and read error protection bytes are equal (YES branch of 122), error protection module 27 returns the verified double word (124). If the new and read error protection bytes are unequal (NO branch of 122) but the error is correctable (YES branch of 126), error correction module 60 corrects the error in the read double word error protection module 27 returns the corrected double word (128). If error correction module 60 determines the error is not correctable (NO branch of 126), error protection module 27 indicates that the double word is corrupt by setting an error line (130).

Figure 5:
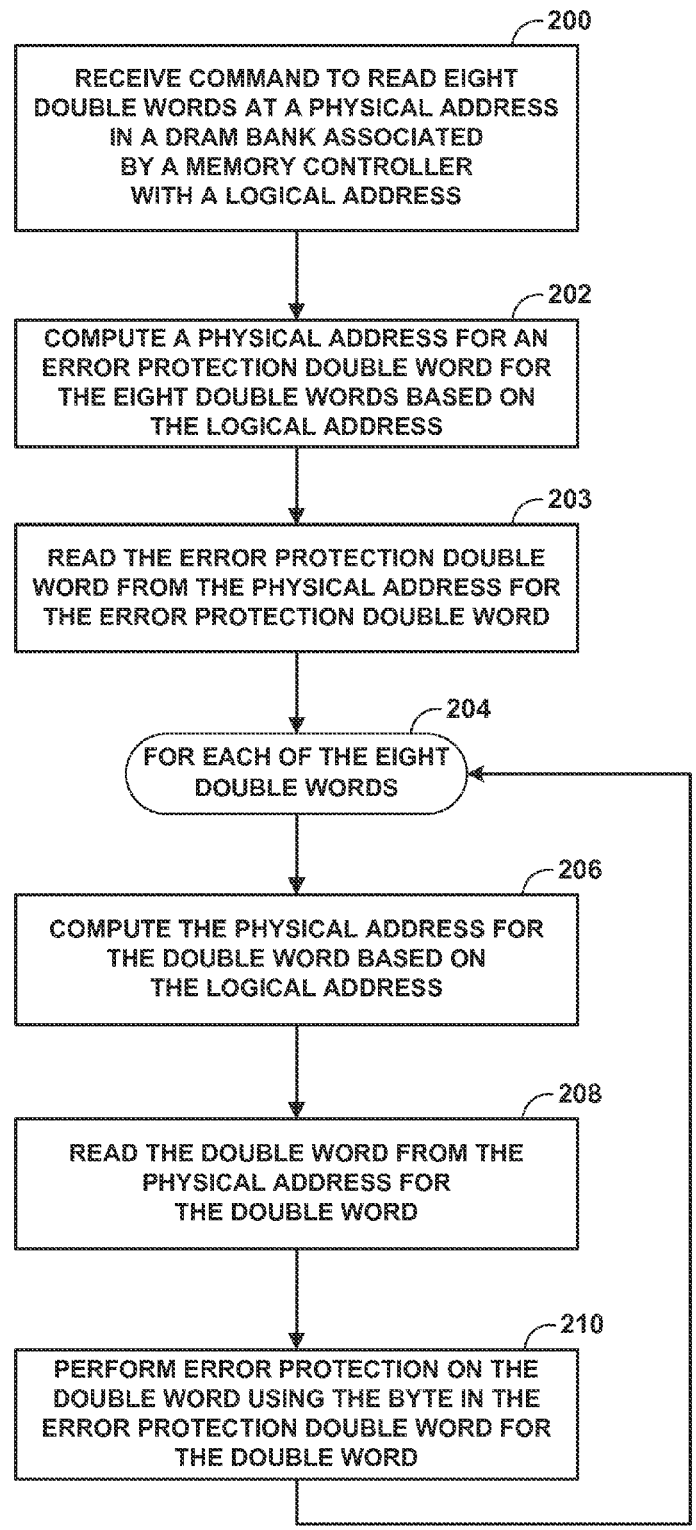
FIG. 5 is a flowchart illustrating an example mode of operation of a memory controller to read multiple double words from a dynamic RAM row all having error protection bytes in a single double word also stored to the dynamic RAM row in accordance with error protection techniques described herein.

FIG. 5 is a flowchart illustrating an example mode of operation of a memory controller to read multiple double words from a DRAM row all having error protection bytes in a single double word also stored to the DRAM row in accordance with error protection techniques described herein. The example mode of operation is described with respect to memory controller 26 of FIG. 2.

Memory controller 26 receives one of commands 50 on a command interface directing memory controller 26 to access a eight double words in one of banks 28 at a logical address in the logical address space presented by memory controller 26 (200). Address translation module 58 reads the logical address from address bus 52 and computes, based on the logical address, a physical address for an error protection double that stores eight error protection bytes for the eight double words to be read (202). Error protection module 27 invokes DRAM controller 62 to read the error protection double word from the physical address in banks 28 computed for the error protection double word (203).

Error protection module 27 iterates to perform error protection techniques on each of the eight requested double words (204). For each of the eight double words, address translation module computes a physical address for the double word based on the received logical address (206). The physical address of the first double word may be an eight double word-aligned physical address, or cell address, in a row of one of banks 28 computed according to one of the techniques described above. Address translation module 58 may compute physical addresses for successive double words by incrementing the physical address computed for the first double word. Error protection module 27 invokes DRAM controller 62 to read the double word from the physical address in banks 28 computed for the double word (208). Error correction module 60 performs error protection of the read double word by computing a new error correction byte; comparing the new correction bytes with the error protection byte in the error protection double word for the read double word; and returning the double word, correcting and returning the double word, or indicating an error (210).

The techniques described herein may be implemented in hardware, software, firmware, or any combination thereof. Various features described as modules, units or components may be implemented together in an integrated logic device or separately as discrete but interoperable logic devices or other hardware devices. In some cases, various features of electronic circuitry may be implemented as one or more integrated circuit devices, such as an integrated circuit chip or chipset.

If implemented in hardware, this disclosure may be directed to an apparatus such a processor or an integrated circuit device, such as an integrated circuit chip or chipset. Alternatively or additionally, if implemented in software or firmware, the techniques may be realized at least in part by a computer-readable data storage medium comprising instructions that, when executed, cause a processor to perform one or more of the methods described above. For example, the computer-readable data storage medium may store such instructions for execution by a processor.

A computer-readable medium may form part of a computer program product, which may include packaging materials. A computer-readable medium may comprise a computer data storage medium such as random access memory (RAM), read-only memory (ROM), non-volatile random access memory (NVRAM), electrically erasable programmable read-only memory (EEPROM), Flash memory, magnetic or optical data storage media, and the like. In some examples, an article of manufacture may comprise one or more computer-readable storage media.

In some examples, the computer-readable storage media may comprise non-transitory media. The term "non-transitory" may indicate that the storage medium is not embodied in a carrier wave or a propagated signal. In certain examples, a non-transitory storage medium may store data that can, over time, change (e.g., in RAM or cache).

The code or instructions may be software and/or firmware executed by processing circuitry including one or more processors, such as one or more digital signal processors (DSPs), general purpose microprocessors, application-specific integrated circuits (ASICs), field-programmable gate arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, functionality described in this disclosure may be provided within software modules or hardware modules.

Various embodiments have been described. These and other embodiments are within the scope of the following examples.

What is claimed is:

1. A method comprising:
receiving, with a memory controller of a computing device that controls a dynamic random access memory (DRAM) comprising a plurality of banks, a write command that specifies data and an address, wherein each of the banks comprises DRAM storage elements arranged in a two-dimensional array of rows and columns, wherein each of the DRAM storage elements is a bit in a physical address space for the DRAM;
in response to receiving the write command,
writing, with the memory controller via a first command to the DRAM, the data to a physical address in the DRAM for the data that is based at least on the address specified in the write command; and
writing, with the memory controller via a second command to the DRAM, error protection bits for the data to a physical address in the DRAM for the error protection bits that is based at least on the address specified in the write command, wherein the physical address in the DRAM for the data and the physical address in the DRAM for the error protection bits identify non-contiguous data storage locations in the physical address space of the DRAM.

2. The method of claim 1, further comprising:
computing, with the memory controller, the error protection bits for the data;
computing the physical address in the DRAM for the data based at least on the address specified within the write command, wherein the physical address in the DRAM for the data is logically located on a single row of a first one of the banks; and
computing the physical address in the DRAM for the error protection bits based at least on the address specified within the write command, wherein the physical address in the DRAM for the error protection bits is logically located on the single row.

3. The method of claim 2,
wherein the single row includes at least one DRAM storage element between DRAM storage elements that store the data and DRAM storage elements that store the error protection bits according to a location of the DRAM storage element bits in the physical address space for the DRAM.

4. The method of claim 2, further comprising:
sending an activate command from the memory controller to the DRAM to activate the single row;
after activating the single row and prior to activating any other row of the first bank, issuing the first command from the memory controller to the DRAM to write the data to the single row and issuing the second command from the memory controller to the DRAM to write the error protection bits to the single row.

5. The method of claim 1, further comprising:
computing, with the memory controller, the error protection bits for the data;
issuing commands from the memory controller to the DRAM to write the data to the physical address in the DRAM for the data associated with a single row of a first one of the banks and the error protection bits to a physical address in the DRAM for the error protection bits associated with the single row; and
issuing commands from the memory controller to the DRAM to read the data stored to the physical address in the DRAM for the data associated with the single row and to read the error protection bits stored to the physical address in the DRAM for the error protection bits associated with the single row.

6. The method of claim 1, further comprising:
receiving, with the memory controller, the address in association with a read command;
computing, with the memory controller, the physical address in the DRAM for the data based at least on the address; and
computing, with the memory controller, the physical address in the DRAM for the error protection bits based at least on the address.

7. The method of claim 6, further comprising:
computing, with the memory controller, new error protection bits for the data read from the physical address in the DRAM for the data; and comparing, with the memory controller, the new error protection bits and the error protection bits read from the physical address in the DRAM for the error protection bits.

8. The method of claim 7, further comprising:
returning, with the memory controller, the data read from the physical address in the DRAM for the data when the new error protection bits and the error protection bits read from the physical address in the DRAM for the error protection bits are equal; and
indicating an error with the memory controller when the new error protection bits and the error protection bits read from the physical address in the DRAM for the error protection bits are not equal.

9. The method of claim 1, further comprising:
associating, with the memory controller by translating addresses from a logical address space to the physical address space, each of a plurality of logical addresses in a contiguous logical address space with a physical address to transparently present the contiguous logical address space using a non-contiguous physical address space within rows of the banks.

10. The method of claim 1, wherein every memory read access to the DRAM by the memory controller is a read burst of an eight byte double word, the method further comprising:
receiving, with the memory controller, a command to read a plurality of double words contiguously stored to a single row of a first one of the banks;
responsive to receiving the command to read the plurality of double words, issuing commands from the memory controller to the DRAM to sequentially read, with sequential read bursts, each of the plurality of double words from the single row;
responsive to receiving the command to read the plurality of double words, issuing commands from the memory controller to the DRAM to read, in a single read burst, an error protection double word that includes error protection bits for each of the plurality of double words, wherein the error protection double word is stored to the single row to avoid activating an additional row in the first one of the banks when reading the error protection double word;
computing, with the memory controller, new error protection bits for the plurality of double words;
comparing, with the memory controller, the error protection bits in the error protection double word to the new error protection bits; and
indicating an error with the memory controller when the error protection bits in the error protection double word and the new error protection bits are not equal.

11. The method of claim 1, wherein each of the banks includes neither dedicated error protection circuitry nor redundant DRAM storage elements dedicated to storing error protection data.

12. A network device comprising:
a dynamic random access memory (DRAM) comprising a plurality of banks, wherein each of the banks comprises DRAM storage elements arranged in a two-dimensional array of rows and columns, wherein each of the DRAM storage elements is a bit in an addressable physical address space for the DRAM;
a memory controller for the DRAM that receives a write command that specifies data and an address,
wherein the memory controller, in response to receiving the write command,
writes, by issuing a first command to the DRAM, the data to a physical address in the DRAM for the data that is based at least on the address, and
writes, by issuing a second command to the DRAM, error protection bits for the data to a physical address in the DRAM for the error protection bits that is based at least on the address, wherein the physical address in the DRAM for the data and the physical address in the DRAM for the error protection bits identify non-contiguous data storage locations in the physical address space of the DRAM.

13. The network device of claim 12, further comprising:
an error correction module that computes the error protection bits for the data,
wherein the memory controller computes the physical address in the DRAM for the data based at least on the address and that is logically located on a single row of a first one of the banks, and
wherein the memory controller computes the physical address in the DRAM for the error protection bits based at least on the address and that is logically located on the single row.

14. The network device of claim 13,
wherein the single row includes at least one DRAM storage element between DRAM storage elements that store the data and DRAM storage elements that store the error protection bits according to a location of the DRAM storage element bits in the physical address space for the DRAM.

15. The network device of claim 13,
wherein the memory controller sends an activate command to the DRAM to activate the single row, and
wherein the memory controller, after activating the single row and prior to activating any other row of the first bank, issues the first command to write the data to the single row and issues the second command to write the error protection bits to the single row.

16. The network device of claim 12, further comprising:
an error correction module that computes the error protection bits for the data,
wherein the DRAM controller issues commands to the DRAM to write the data to the physical address in the DRAM associated with a single row of a first one of the banks and the error protection bits to the physical address in the DRAM for the error protection bits associated with the single row, and
wherein the DRAM controller issues commands to the DRAM to read the data stored to the physical address in the DRAM associated with the single row and to read the error protection bits stored to the physical address in the DRAM for the error protection bits associated with the single row.

17. The network device of claim 12,
wherein the memory controller receives the address in association with a read command,
wherein the address translation module computes the physical address in the DRAM for the data based at least on the logical address, and
wherein the address translation module computes the physical address in the DRAM for the error protection bits based at least on the logical address.

18. The network device of claim 17,
wherein the error correction module computes new error protection bits for the data read from the physical address in the DRAM for the data, and wherein the error correction module compares the new error protection bits and the error protection bits read from the physical address in the DRAM for the error protection bits.

19. The network device of claim 18,
wherein the memory controller returns the data read from the physical address in the DRAM for the data when the new error protection bits and the error protection bits read from the physical address in the DRAM for the error protection bits are equal, and
wherein the memory controller indicates an error when the new error protection bits and the error protection bits read from the physical address in the DRAM for the error protection bits are not equal.

20. The network device of claim 12,
wherein the memory controller associates, by translating addresses from a logical address space to the physical address space, each of a plurality of logical addresses in a contiguous logical address space with a physical address to transparently present the contiguous logical address space using a non-contiguous physical address space within rows of the banks.

21. The network device of claim 12,
wherein the DRAM controller performs every memory read access to the DRAM as a read burst of an eight byte double word,
wherein the memory controller receives a command to read a plurality of double words contiguously stored to a single row of a first one of the banks,
wherein the DRAM controller, responsive to receiving the command to read the plurality of double words, issues commands to the DRAM to sequentially read, with sequential read bursts, each of the plurality of double words from the single row;
wherein the DRAM controller, responsive to receiving the command to read the plurality of double words, issues commands to the DRAM to read, in a single read burst, an error protection double word that includes error protection bits for each of the plurality of double words, wherein the error protection double word is stored to the single row to avoid activating an additional row in the first one of the banks when reading the error protection double word,
wherein the error correction module computes new error protection bits for the plurality of double words;
wherein the error correction module compares the error protection bits in the error protection double word to the new error protection bits, and
wherein the memory controller indicates an error when the error protection bits in the error protection double word and the new error protection bits are not equal.

22. The network device of claim 12, wherein each of the banks includes neither dedicated error protection circuitry nor redundant DRAM storage elements dedicated to storing error protection data.

23. A non-transitory computer-readable medium comprising instructions for causing one or more programmable processors to:
receive, with a memory controller of a computing device that controls a dynamic random access memory (DRAM) comprising a plurality of banks, a write command that specifies data and an address, wherein each of the banks comprises DRAM storage elements arranged in a two-dimensional array of rows and columns, wherein each of the DRAM storage elements is a bit in a physical address space for the DRAM;
in response to receiving the write command,
write, with the memory controller via a first command to the DRAM, the data to a physical address in the DRAM for the data that is based at least on the address; and
write, with the memory controller via a second command to the DRAM, error protection bits for the data to a physical address in the DRAM for the error protection bits that is based at least on the address, wherein the physical address in the DRAM for the data and the physical address in the DRAM for the error protection bits identify non-contiguous data storage locations in the physical address space of the DRAM.

\* \* \* \* \*